(12) United States Patent
Suzuki et al.

(10) Patent No.: US 10,879,892 B2
(45) Date of Patent: Dec. 29, 2020

(54) SWITCHING ELEMENT CONTROL CIRCUIT AND POWER MODULE

(71) Applicant: SHINDENGEN ELECTRIC MANUFACTURING CO., LTD., Tokyo (JP)

(72) Inventors: Kenichi Suzuki, Saitama (JP); Wataru Miyazawa, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 16/605,803

(22) PCT Filed: Apr. 25, 2017

(86) PCT No.: PCT/JP2017/016447
§ 371 (c)(1),
(2) Date: Oct. 17, 2019

(87) PCT Pub. No.: WO2018/198211
PCT Pub. Date: Nov. 1, 2018

(65) Prior Publication Data
US 2020/0052692 A1    Feb. 13, 2020

(51) Int. Cl.
*H03K 17/687* (2006.01)
*H03K 17/06* (2006.01)
(Continued)

(52) U.S. Cl.
CPC ......... *H03K 17/687* (2013.01); *H03K 17/063* (2013.01); *H03K 17/14* (2013.01);
(Continued)

(58) Field of Classification Search
CPC ..... G11C 11/5628; G11C 16/10; G11C 16/12; G11C 16/3459; G11C 16/0483;
(Continued)

(56) References Cited

U.S. PATENT DOCUMENTS

| 8,378,404 B2 | 2/2013 | Chen |
| 2010/0045650 A1 | 2/2010 | Fish et al. |

(Continued)

FOREIGN PATENT DOCUMENTS

WO    2012/153459 A1    11/2012

OTHER PUBLICATIONS

International Search Report in PCT/JP2017/016447, dated Jul. 25, 2017. 3pp.

*Primary Examiner* — Sibin Chen
(74) *Attorney, Agent, or Firm* — Hauptman Ham, LLP

(57) ABSTRACT

A switching element control circuit is configured to perform a measurement mode in which a threshold voltage of a switching element is measured and a control mode in which an ON/OFF operation of the switching element is controlled in a switching manner. The switching element control circuit includes: a threshold voltage measurement power source; a third electrode voltage control part; an ON/OFF state determination part; and a memory part which stores the third electrode voltage applied to the third electrode as a threshold voltage of the switching element. The third electrode voltage control part controls, in the control mode, the third electrode voltage based on information including the threshold voltage stored in the memory part at the time of bringing the switching element into an ON state.

7 Claims, 6 Drawing Sheets

(51) Int. Cl.
*H03K 17/14* (2006.01)
*H03K 17/18* (2006.01)
*H03K 17/567* (2006.01)
*H02M 1/00* (2006.01)

(52) U.S. Cl.
CPC .......... *H03K 17/18* (2013.01); *H03K 17/567* (2013.01); *H02M 2001/0054* (2013.01)

(58) Field of Classification Search
CPC .... H03K 17/687; H03K 17/063; H03K 17/14; H03K 17/18; H03K 17/567; H03K 17/412; H03K 17/00; H03K 2217/0081; H02M 2001/0054; H02M 1/08
See application file for complete search history.

(56) References Cited

U.S. PATENT DOCUMENTS

2013/0147525 A1    6/2013   Takagiwa
2014/0320545 A1   10/2014   Jeon
2016/0146879 A1*   5/2016   Uppal .................... G01R 31/14
                                                               324/750.01

* cited by examiner

SWITCHING ELEMENT CONTROL CIRCUIT AND POWER MODULE

RELATED APPLICATIONS

The present application is a National Phase of International Application Number PCT/JP2017/016447, filed Apr. 25, 2017.

TECHNICAL FIELD

The present invention relates to a switching element control circuit and a power module.

BACKGROUND ART

Conventionally, there has been known a switching element control circuit which controls an ON/OFF operation of a switching element (see patent document 1, for example).

As shown in FIG. 7, a conventional switching element control circuit 900 includes a gate voltage control part 920 which controls a gate voltage for controlling an ON/OFF operation of a switching element 800.

According to the conventional switching element control circuit 900, an ON/OFF operation of the switching element 800 can be controlled by controlling a gate voltage.

PRIOR ART DOCUMENT

Patent Document

Patent document 1: WO/2012/153459

SUMMARY OF INVENTION

Problem to be Solved by the Invention

Recently, there has been a demand for a switching element control circuit capable of reducing a switching loss of a switching element by increasing a switching speed of a switching element. As one of methods for satisfying such a demand, a switching element control circuit is considered where a switching loss of a switching element is reduced in such a manner that a turn-on period and a turn-off period are shortened by applying a gate voltage slightly exceeding a threshold voltage to a gate electrode thus increasing a switching speed of the switching element (see FIG. 4A and FIG. 4B).

However, a threshold voltage of the switching element changes due to irregularities in the manufacture of switching elements (see FIG. 4B), it is difficult to apply a gate voltage slightly exceeding the threshold voltage to the gate electrode of the switching element. Accordingly, there exists a drawback that it is difficult to increase a switching speed of the switching element so that it is difficult to reduce a switching loss of the switching element.

Further, in a case where a threshold voltage of the switching element changes in a direction that the threshold voltage becomes higher than a designed threshold voltage due to irregularities in the manufacture of switching elements, there is a possibility that even when a gate voltage slightly exceeding the designed threshold voltage is applied to the gate electrode, the switching element is not brought into an ON state thus also giving rise to a drawback that an ON/OFF operation of the switching element may not be controlled. Particularly, when the difference between an absolute maximum rated voltage and a threshold voltage is small as in the case of a switching element formed using a material containing GaN or the like, this drawback becomes more conspicuous.

It is also theoretically possible to measure a threshold voltage of a switching element before the switching element is assembled to a switching element control circuit and to decide a gate voltage based on the measured threshold voltage. However, in general, switching elements are manufactured on a mass production basis. Accordingly, in a case where threshold voltages of the respective manufactured switching elements are measured, such a measurement operation becomes extremely cumbersome thus also giving rise to a drawback that it is difficult to increase productivity.

The present invention has been made to overcome the above-mentioned drawbacks, and it is an object of the present invention to provide a switching element control circuit capable of reducing a switching loss of a switching element, capable of controlling an ON/OFF operation of the switching element with certainty, and capable of increasing productivity of switching elements. It is another object of the present invention to provide a power module provided with such a switching element control circuit.

Solution to Problem

[1] According to the present invention, there is provided a switching element control circuit configured to perform a measurement mode in which a threshold voltage of a switching element having a first electrode, a second electrode, and a third electrode is measured and a control mode in which an ON/OFF operation of the switching element is controlled in a switching manner, the switching element control circuit which includes: a threshold voltage measurement power source which supplies, in the measurement mode, an electric current to the first electrode of the switching element; a third electrode voltage control part which controls, in the measurement mode, a third electrode voltage such that the third electrode voltage is increased in a stepwise manner and controls, in the control mode, the third electrode voltage so as to control the ON/OFF operation of the switching element; an ON/OFF state determination part which determines, in the measurement mode, an ON/OFF state of the switching element; and a memory part which stores, in the measurement mode, the third electrode voltage applied to the third electrode as a threshold voltage of the switching element when the ON/OFF state determination part determines that the switching element is brought into an ON state, wherein the third electrode voltage control part controls, in the control mode, the third electrode voltage based on information including the threshold voltage stored in the memory part at the time of bringing the switching element into an ON state.

[2] According to the present invention, it is preferable that the switching element control circuit further include a first electrode current detection part which detects a first electrode current flowing in the switching element, wherein the ON/OFF state determination part determine, in the measurement mode, the ON/OFF state of the switching element based on a detection result of the first electrode current obtained by the first electrode current detection part.

[3] In the switching element control circuit according to the present invention, it is preferable that the third electrode voltage control part control, in the measurement mode, the third electrode voltage such that the third electrode voltage is increased in a continuous stepwise manner along with a lapse of time.

[4] In the switching element control circuit according to the present invention, it is preferable that the third electrode voltage control part control, in the measurement mode, the third electrode voltage such that the third electrode voltage becomes a pulse-like voltage which is a pulse having amplitude increased along with a lapse of time.

[5] According to the switching element control circuit of the present invention, it is preferable that the switching element be a MOSFET, an IGBT or a HEMT.

[6] According to the switching element control circuit of the present invention, it is preferable that the switching element be formed using a material which contains GaN, SiC or $Ga_2O_3$.

[7] According to the present invention, there is provided a power module which includes: a switching element having a first electrode, a second electrode and a third electrode; and the switching element control circuit according to any one of [1] to [6].

Advantageous Effects of the Present Invention

In the switching element control circuit according to the present invention, in the measurement mode, a threshold voltage of the switching element actually connected to the switching element control circuit (hereinafter, referred to as "actual threshold voltage") can be measured. In the control mode, a third electrode voltage applied to the third electrode can be controlled based on the actual threshold voltage at the time of bringing the switching element into an ON state. With such a configuration, even in a case where an actual threshold voltage changes from a designed threshold voltage due to irregularities in the manufacture of switching elements, at the time of bringing the switching element into an ON state, a third electrode voltage which slightly exceeds the actual threshold voltage can be applied to the third electrode of the switching element based on the actual threshold voltage. Accordingly, compared to a case where a third electrode voltage which largely exceeds a preliminarily designed threshold voltage is applied to a third electrode (comparison example, see FIG. 4A), a turn-on period and a turn-off period can be shortened and hence, a switching speed of the switching element can be increased. As a result, an energy loss of the switching element can be reduced.

In the switching element control circuit according to the present invention, as described above, a third electrode voltage which slightly exceeds an actual threshold voltage can be applied to the third electrode based on the actual threshold voltage at the time of bringing the switching element into an ON state. Accordingly, even when the actual threshold voltage changes in a direction that the actual threshold voltage becomes higher than a designed threshold voltage due to irregularities in the manufacture of switching elements, a third electrode voltage which slightly exceeds the actual threshold voltage can be applied to the third electrode. Accordingly, it is possible to prevent the occurrence of a phenomenon where a switching element is not brought into an ON state even when a third electrode voltage which slightly exceeds a threshold voltage (designed threshold voltage) is applied to the third electrode. As a result, an ON/OFF operation of the switching element can be controlled with certainty.

Particularly, even when a difference between an absolute maximum rated voltage and a threshold voltage is small as in the case where the switching element is formed using a material which contains GaN, a third electrode voltage which slightly exceeds an actual threshold voltage can be applied to the third electrode. Accordingly, it is possible to prevent the occurrence of a phenomenon where a switching element is not brought into an ON state even when a third electrode voltage which slightly exceeds a threshold voltage (designed threshold voltage) is applied to the third electrode. As a result, an ON/OFF operation of the switching element can be controlled with certainty.

Further, in the switching element control circuit according to the present invention, in a measurement mode, an actual threshold voltage can be measured, and in a control mode, a third electrode voltage applied to the third electrode can be controlled based on the actual threshold voltage at the time of bringing the switching element into an ON state. Accordingly, even in the case where switching elements are manufactured on a mass production basis, it is unnecessary to measure threshold voltages of the respective manufactured switching elements before connecting the respective switching elements to the switching element control circuit. Accordingly, the measurement operation does not become cumbersome and hence, productivity of the switching elements can be easily enhanced.

BRIEF DESCRIPTION OF DRAWINGS

FIG. 4A is a schematic view of a graph showing a change with time of a gate-source voltage when a gate voltage is applied to a gate electrode in a switching element control circuit according to a comparison example, and FIG. 4B is a schematic view of a graph showing a change with time of a gate-source voltage when a gate voltage which slightly exceeds a threshold voltage is applied to a gate electrode in the switching element control circuit 100 according to the embodiment.

DESCRIPTION OF EMBODIMENTS

Hereinafter, a switching element control circuit and a power module according to the present invention are described based on an embodiment shown in drawings. The respective drawings are schematic views, and do not always strictly reflect the actual circuit configuration and actual graphs.

EMBODIMENT

Figure 1:
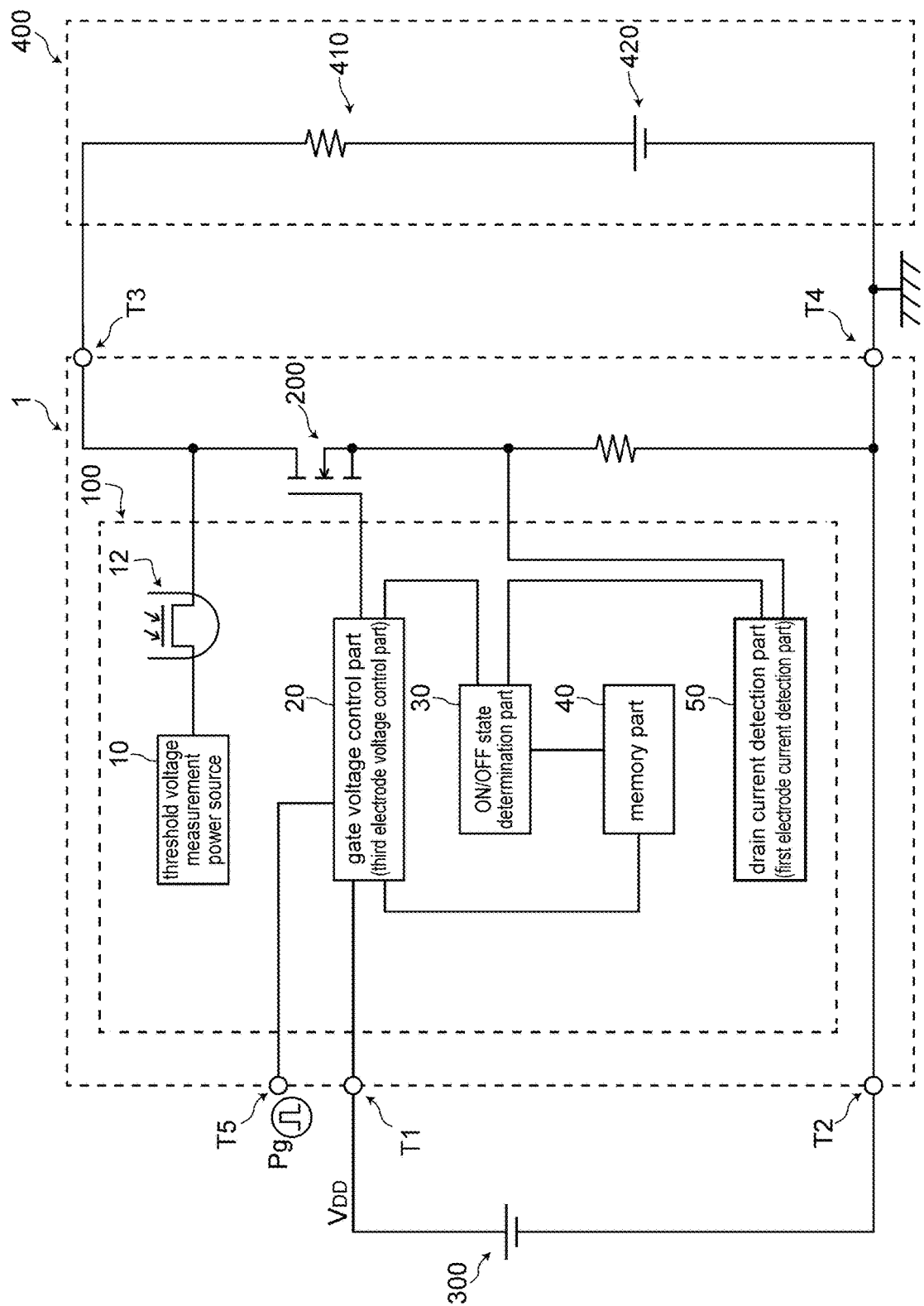
FIG. 1 is a circuit diagram showing a power module 1 and a switching element control circuit 100 according to an embodiment.

1. Configuration of Power Module 1 and Switching Element Control Circuit 100 According to Embodiment As shown in FIG. 1, a power module 1 according to the embodiment includes: a switching element 200; and a switching element control circuit 100 according to the embodiment which controls an ON/OFF operation of the switching element 200. The power module 1 according to the embodiment is covered by a package formed using a resin, ceramics or the like having high heat resistance and high insulating property. The power module 1 according to the embodiment includes: a (+) side input terminal T1 to which a DC power source voltage $V_{DD}$ is inputted; a (−) side input terminal T2 on a ground side; a (+) side output terminal T3; a (−) side output terminal T4 on the ground side; and a control terminal T5 to which a drive signal (for example, a gate pulse) Pg is inputted.

A gate drive power source 300 for applying a power source voltage $V_{DD}$ is connected between the (+) side input terminal T1 and the (−) side input terminal T2. The gate drive power source 300 is connected to a gate electrode of the switching element 200 via a gate voltage control part 20, and supplies a voltage to the gate electrode. A load circuit 400 is connected to the (+) side output terminal T3 and the (−) side output terminal T4. The load circuit 400 includes, for example, a load resistor 410 and a DC drive power source 420. The load resistor 410 and the DC drive power source 420 are connected in series between the (+) side output terminal T3 and the (−) side output terminal T4. The (−) side output terminal T4 is grounded.

The switching element 200 is a MOSFET which includes a source electrode (second electrode), a drain electrode (first electrode), and the gate electrode (third electrode). The switching element 200 is brought into an ON state when a gate voltage (third electrode voltage) which exceeds a threshold voltage (actual threshold voltage Vth) is applied to the gate electrode, and the switching element 200 is brought into an OFF state when the gate voltage becomes lower than the threshold voltage. The gate voltage is supplied from the power source voltage $V_{DD}$, and is controlled by the gate voltage control part 20 (third electrode voltage control part) described later. A suitable switching element can be used as the switching element 200. In this embodiment, the switching element 200 is a MOSFET. Further, the switching element 200 is formed using a material which contains GaN.

The drain electrode of the switching element 200 is connected to the load circuit 400 via the (+) side output terminal T3, and is connected to a threshold voltage measurement power source 10 described later via a threshold voltage measurement switch 12 described later. The gate electrode of the switching element 200 is connected to the gate voltage control part 20. The source electrode of the switching element 200 is connected to a drain current detection part 50, and is connected to the (−) side output terminal T4 via a resistor.

The switching element control circuit 100 according to the embodiment includes: the threshold voltage measurement power source 10; the threshold voltage measurement switch 12; the gate voltage control part 20 (the third electrode voltage control part); an ON/OFF state determination part 30; a memory part 40; and the drain current detection part 50 (first electrode current detection part).

In a measurement mode, the threshold voltage measurement power source 10 supplies an electric current for threshold voltage measurement to the drain electrode (first electrode) of the switching element 200 by turning on the threshold voltage measurement switch 12. In a control mode, the threshold voltage measurement power source 10 stops the supply of the electric current for threshold voltage measurement from the threshold voltage measurement power source 10 to the switching element 200 by turning off the threshold voltage measurement switch 12.

A suitable switch can be used as the threshold voltage measurement switch 12. For example, a photocoupler can be used as the threshold voltage measurement switch 12.

The gate voltage control part 20 controls a gate voltage such that the gate voltage is increased in a stepwise manner in a measurement mode. The gate voltage control part 20 controls a gate voltage applied to the gate electrode for controlling an ON/OFF operation of the switching element 200 in a control mode. In the control mode, the gate voltage control part 20 controls a gate voltage based on information including a threshold voltage stored in the memory part 40 at the time of bringing the switching element 200 into an ON state.

When the ON/OFF state determination part 30 described later determines that the switching element 200 is in an OFF state, the gate voltage control part 20 controls a gate voltage such that the gate voltage is increased in a continuous stepwise manner by one stage (see FIG. 5). Further, when the ON/OFF state determination part 30 described later determines that the switching element 200 is in an ON state, the gate voltage control part 20 transmits a gate voltage Vgs applied to the gate electrode to the memory part 40 as a threshold voltage.

In the measurement mode, the drain current detection part 50 detects a drain current Id (source current) of the switching element 200, and transmits a detection result to the ON/OFF state determination part 30. The drain current detection part 50 measures a drain current Id by supplying an electric current to the resistor connected to the source electrode of the switching element 200 and converting the electric current to a voltage. However, a suitable detection device may be used as the drain current detection part 50.

In the measurement mode, the ON/OFF state determination part 30 determines an ON/OFF state of the switching element 200 based on a detection result received from the drain current detection part 50.

In the measurement mode, the memory part 40 stores the gate voltage applied to the gate electrode as a threshold voltage of the switching element 200 when the ON/OFF state determination part 30 determines that the switching element 200 is brought into an ON state.

The gate voltage control part 20 is connected to the gate drive power source 300 via the (+) side input terminal T1, and is connected to the control terminal T5. The gate voltage control part 20 is also connected to the memory part 40. The ON/OFF state determination part 30 is connected to the gate voltage control part 20, the memory part 40 and the drain current detection part 50 respectively.

2. Operation of Switching Element Control Circuit 100 According to Embodiment

The switching element control circuit 100 according to the embodiment is configured to perform a measurement mode where a threshold voltage of the switching element is measured and a control mode where an ON/OFF operation of the switching element is controlled in a switching manner.

(1) Measurement Mode

The measurement mode is a mode where a threshold voltage of the switching element 200 connected to the switching element control circuit 100 is measured. This mode is performed before the switching element control circuit 100 and the switching element 200 are driven or is performed in a state where driving of the switching element control circuit 100 and the switching element 200 is temporarily stopped.

Figure 2:
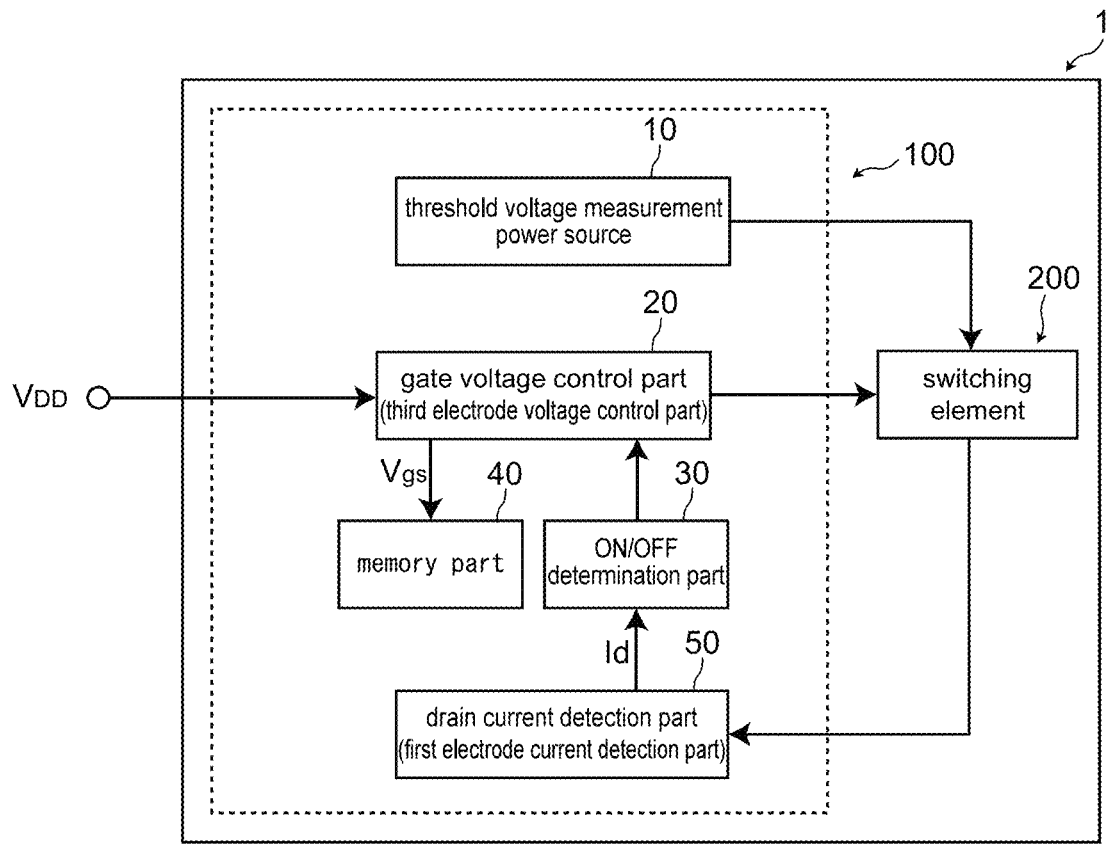
FIG. 2 is a block diagram for explaining a measurement mode of the switching element control circuit 100 according to the embodiment.

In the measurement mode, a threshold voltage of the switching element 200 is measured in a state where an electric current is not supplied from the drive power source 420. Then, an electric current for threshold voltage measurement is supplied from the threshold voltage measurement power source 10 to the drain electrode of the switching element 200 (see FIG. 2).

Figure 5:
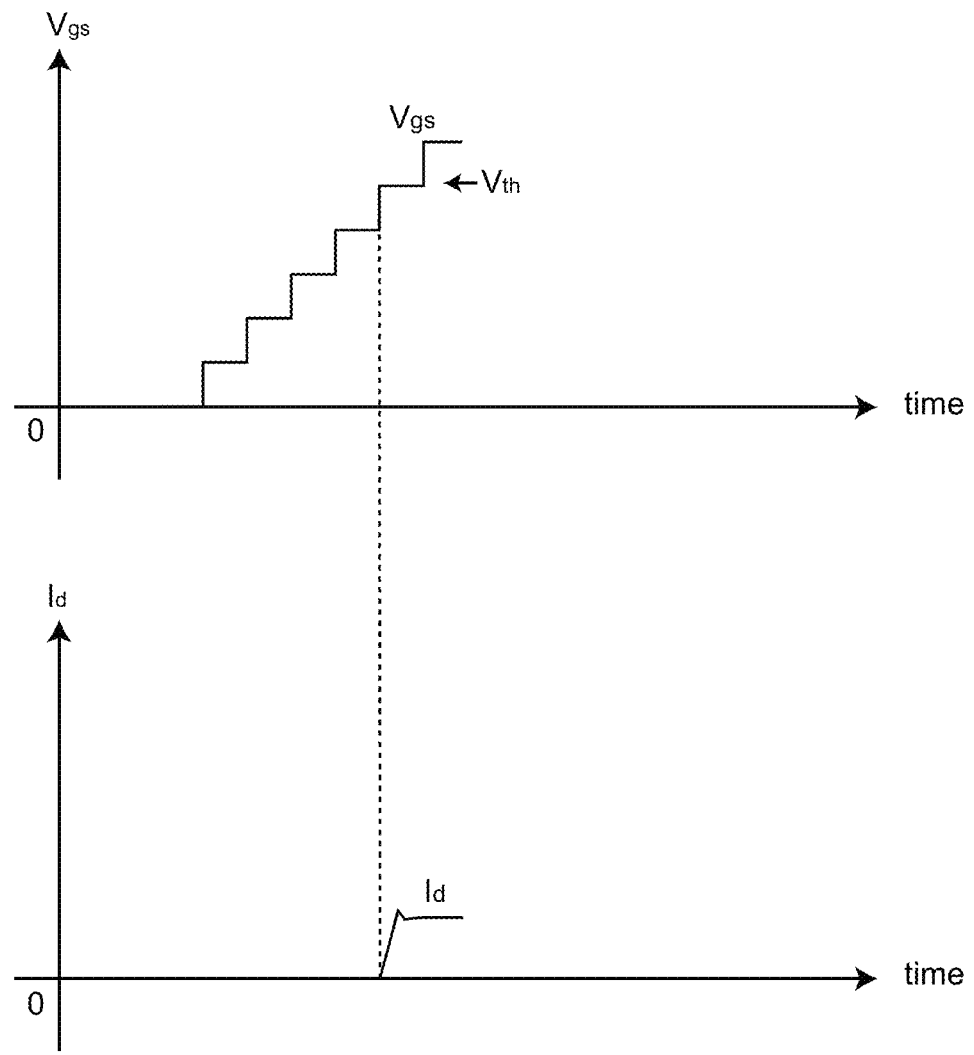
FIG. 5 is a view for explaining a measurement mode of the embodiment.

Next, the gate voltage control part 20 controls a gate voltage such that the gate voltage is increased in a continuous stepwise manner along with a lapse of time (see FIG. 5). To be more specific, the gate voltage control part 20 controls a gate voltage as follows.

First, the gate voltage control part 20 controls a gate voltage such that a voltage lower than an estimated threshold voltage is applied to the gate electrode. At this stage of operation, a drain current is not detected by the drain current detection part 50 (a value of the drain current being 0) and hence, the ON/OFF state determination part 30 determines that the switching element 200 is in an OFF state. When the ON/OFF state determination part 30 determines that the switching element 200 is in an OFF state, the gate voltage control part 20 controls a gate voltage such that the gate voltage is increased by one stage (see FIG. 5). When the gate voltage is gradually increased by repeating such a configuration and a drain current is detected by the drain current detection part 50 (the drain current taking a value other than 0), the ON/OFF state determination part 30 determines that the switching element 200 is in an ON state. When the ON/OFF state determination part 30 determines that the switching element 200 is in an ON state, the gate voltage control part 20 transmits a gate voltage Vgs applied to the gate electrode to the memory part 40 as a threshold voltage. Then, the memory part 40 stores the gate voltage Vgs applied to the gate electrode when the drain current is detected as the threshold voltage.

(2) Control Mode

Figure 3:
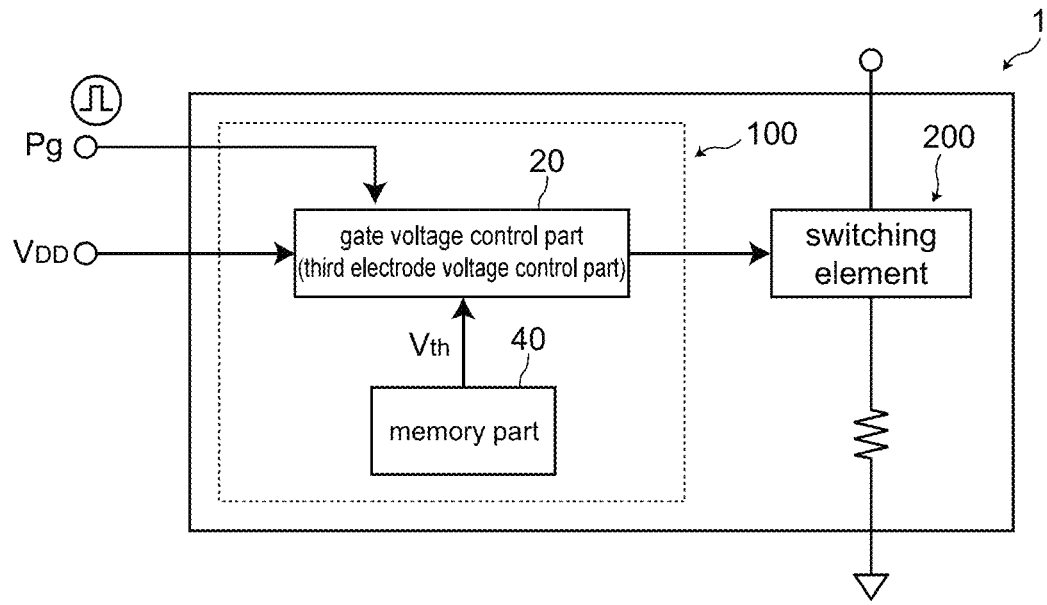
FIG. 3 is a block diagram for explaining a control mode of the switching element control circuit 100 according to the embodiment.

The control mode is a mode where an ON/OFF operation of the switching element 200 is controlled in response to a drive signal (for example, a gate pulse) Pg from the control terminal T5 in a state where the threshold voltage measurement switch 12 is turned off and the switching element 200 is connected to the load resistor 410 and the drive power source 420. In the control mode, at the time of bringing the switching element 200 into an ON state, a gate voltage which slightly exceeds a threshold voltage is applied to the gate electrode based on information including the threshold voltage stored in the memory part 40 (see FIG. 3). At the time of bringing the switching element 200 into an OFF state, a gate voltage applied to the gate electrode is set to a value lower than the threshold voltage Vth.

Figure 4A:
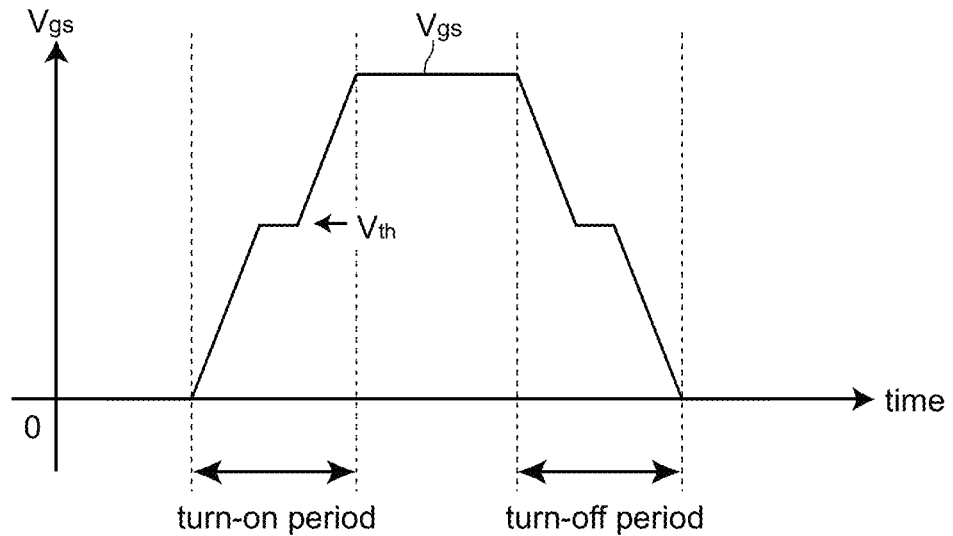
FIG. 4A and FIG. 4B are views for explaining effects when a gate voltage which slightly exceeds a threshold voltage is applied to a gate electrode.
Figure 4B:
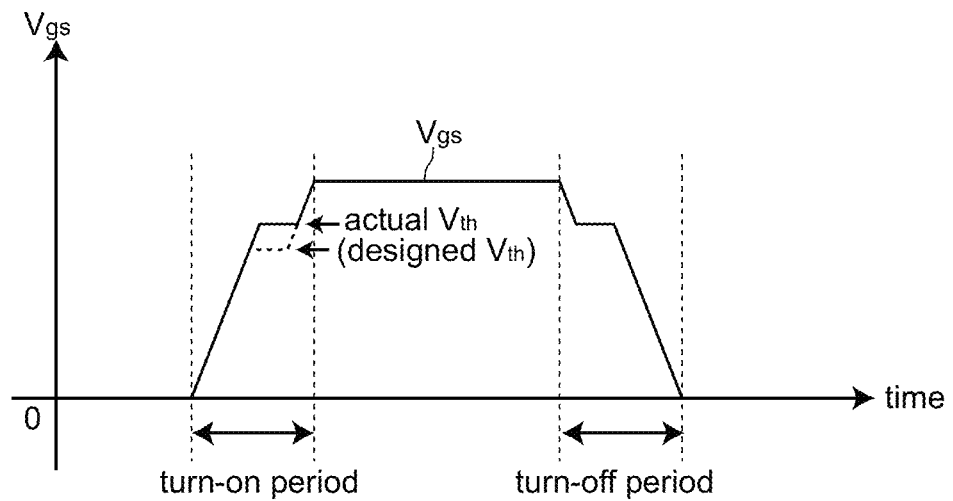

3. Advantageous Effects of Switching Element Control Circuit 100 and Power Module 1 According to Embodiment In the switching element control circuit 100 and the power module 1 according to the embodiment, in the measurement mode, an actual threshold voltage of the switching element 200 actually connected to the switching element control circuit 100 can be measured. In the control mode, a gate voltage applied to the gate electrode can be controlled based on information including the actual threshold voltage at the time of bringing the switching element 200 into an ON state. With such a configuration, even in a case where an actual threshold voltage changes from a designed threshold voltage due to irregularities in the manufacture of switching element 200, at the time of bringing the switching element 200 into an ON state, a gate voltage which slightly exceeds the actual threshold voltage can be applied to the gate electrode of the switching element based on the actual threshold voltage. Accordingly, compared to a case where a gate voltage which largely exceeds a threshold voltage is applied to a gate electrode of a switching element for controlling an ON/OFF operation of the switching element with certainty (comparison example, see FIG. 4A), a turn-on period and a turn-off period can be shortened and hence, a switching speed of the switching element can be increased. As a result, an energy loss of the switching element can be reduced.

In the switching element control circuit 100 and the power module 1 according to the embodiment, as described above, a gate voltage which slightly exceeds an actual threshold voltage can be applied to the gate electrode based on the actual threshold voltage at the time of bringing the switching element 200 into an ON state. Accordingly, even when the actual threshold voltage changes in a direction that the actual threshold voltage becomes higher than a designed threshold voltage due to irregularities in the manufacture of the switching element 200, the gate voltage which slightly exceeds the actual threshold voltage can be applied to the gate electrode. Accordingly, it is possible to prevent the occurrence of a phenomenon where a switching element is not brought into an ON state even when a gate voltage which slightly exceeds a threshold voltage (designed threshold voltage) is applied to the gate electrode. As a result, an ON/OFF operation of the switching element 200 can be controlled with certainty.

Particularly, even when a difference between an absolute maximum rated voltage and a threshold voltage is small as in the case where the switching element 200 is formed using a material which contains GaN, a gate voltage which slightly exceeds an actual threshold voltage can be applied to the gate electrode. Accordingly, it is possible to prevent the occurrence of a phenomenon where the switching element 200 is not brought into an ON state even when a gate voltage which slightly exceeds a threshold voltage (designed threshold voltage) is applied to the gate electrode. As a result, an ON/OFF operation of the switching element 200 can be controlled with certainty.

Further, in the switching element control circuit 100 and the power module 1 according to the embodiment, in a measurement mode, an actual threshold voltage can be measured, and in a control mode, a gate voltage applied to the gate electrode can be controlled based on information including the actual threshold voltage at the time of bringing the switching element into an ON state. Accordingly, even in the case where switching elements 200 are manufactured on a mass production basis, it is unnecessary to measure threshold voltages of the respective manufactured switching elements before connecting the respective switching elements 200 to the switching element control circuit 100. Accordingly, the measurement operation does not become cumbersome and hence, productivity of the switching elements can be easily enhanced.

The switching element control circuit 100 according to the embodiment includes the drain current detection part 50 which detects a drain current flowing in the switching element 200. In the measurement mode, the ON/OFF state determination part 30 determines an ON/OFF state of the switching element 200 based on a detection result of the drain current obtained by the drain current detection part 50. Accordingly, a threshold voltage of the switching element 200 can be measured easily and with certainty.

In the switching element control circuit 100 according to the embodiment, in the measurement mode, the gate voltage control part 20 controls a gate voltage such that a gate voltage is increased in a continuous stepwise manner along with a lapse of time. Accordingly, a threshold voltage of the switching element 200 can be measured efficiently and with certainty.

In the switching element control circuit 100 according to the embodiment, the switching element 200 is a MOSFET and hence, the switching element control circuit 100 becomes a switching element control circuit capable of performing high speed switching.

The switching element 200 is formed using a material which contains GaN and hence, a difference between an absolute maximum rated voltage and a threshold voltage becomes small. Even in such a case, according to the switching element control circuit 100 of the embodiment, a gate voltage which slightly exceeds an actual threshold voltage can be applied to the gate electrode. Accordingly, it is possible to prevent the occurrence of a phenomenon where the switching element 200 is not brought into an ON state even when a gate voltage which slightly exceeds a threshold voltage (designed threshold voltage) is applied to the gate electrode. As a result, an ON/OFF operation of the switching element 200 can be controlled with certainty.

Further, in the power module 1 according to the embodiment, the switching element 200 is formed using a material which contains GaN. Accordingly, the switching element 200 becomes a switching element having a low ON resistance and hence, it is possible to provide a power module having a small conduction loss.

[Modification]

Figure 6:
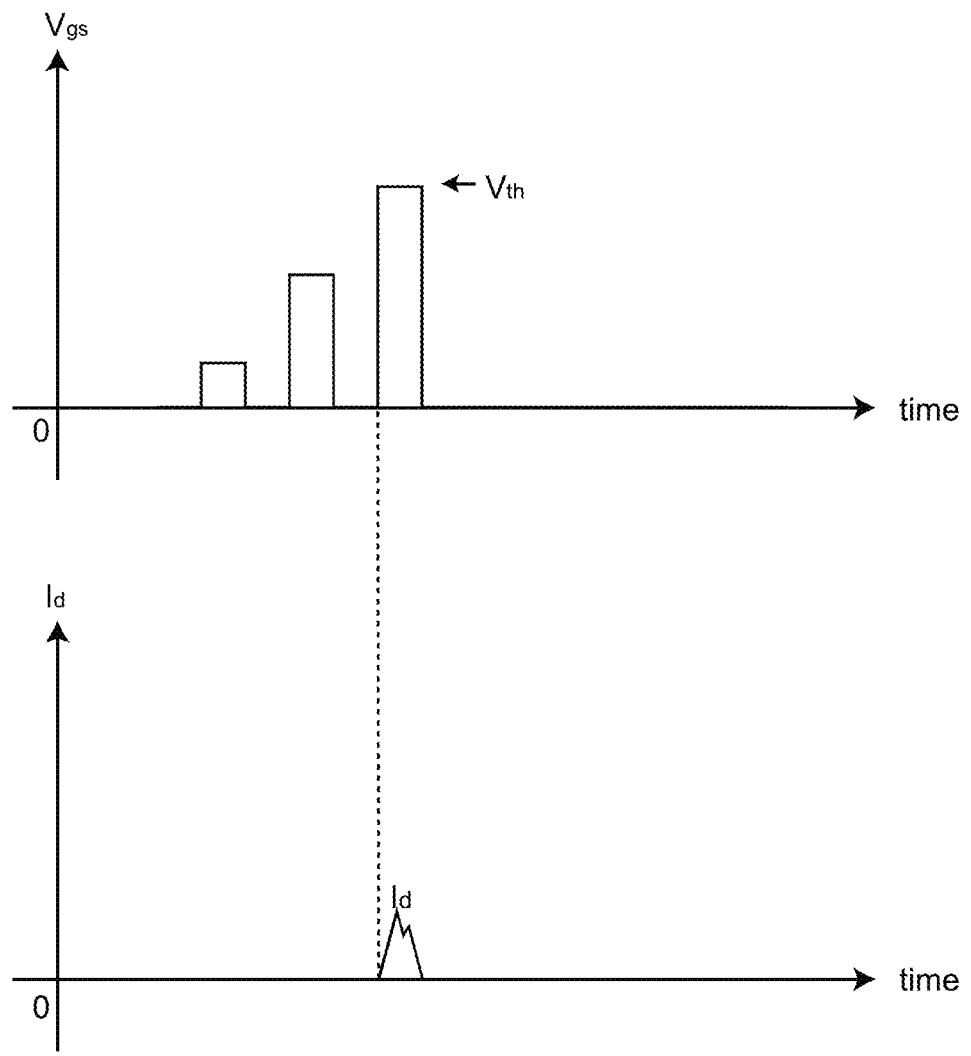
FIG. 6 is a view for explaining a measurement mode of a modification.
Figure 7:
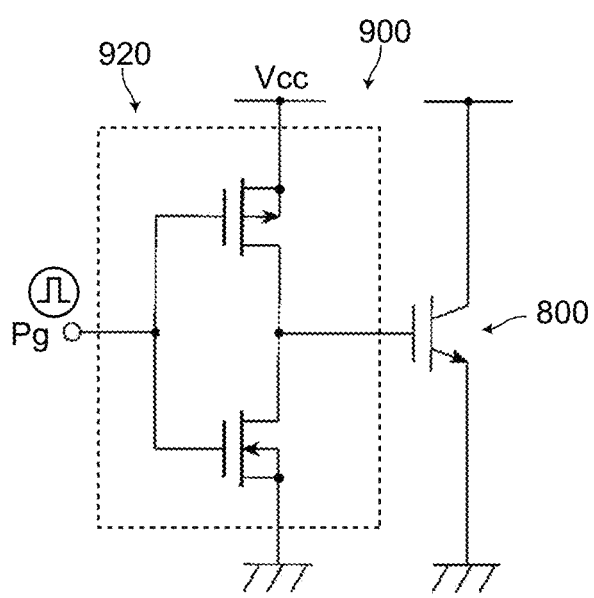
FIG. 7 is a view for explaining a conventional switching element control circuit 900.

A switching element control circuit according to a modification (now shown in the drawing) has substantially the same configuration as the switching element control circuit according to the embodiment basically. However, the switching element control circuit according to the modification differs from the switching element control circuit 100 according to the embodiment with respect to the profile of a gate voltage in a measurement mode. That is, in the switching element control circuit according to the modification, in the measurement mode, the gate voltage control part 20 controls a gate voltage such that the gate voltage becomes a pulse-like voltage which is a pulse having amplitude increased along with a lapse of time (see FIG. 6). In other words, in the switching element control circuit according to the modification, in the measurement mode, the gate voltage control part 20 controls a gate voltage in a discontinuous stepwise manner.

In this manner, the switching element control circuit according to the modification differs from the switching element control circuit 100 according to the embodiment with respect to the configuration of a gate voltage in a measurement mode. However, in the same manner as the switching element control circuit 100 according to the embodiment, in the measurement mode, an actual threshold voltage of the switching element actually connected to the switching element control circuit can be measured. In a control mode, a gate voltage applied to the gate electrode can be controlled based on information which includes the actual threshold voltage at the time of bringing the switching element into an ON state. With such a configuration, even in a case where the actual threshold voltage changes from a designed threshold voltage due to irregularities in the manufacture of switching elements, at the time of bringing the switching element into an ON state, a gate voltage which slightly exceeds the actual threshold voltage can be applied to the gate electrode of the switching element based on the actual threshold voltage. Accordingly, a turn-on period and a turn-off period can be shortened and hence, a switching speed of the switching element can be increased. As a result, an energy loss of the switching element can be reduced.

The switching element control circuit according to the modification has substantially the same configuration as the switching element control circuit 100 according to the embodiment with respect to points other than the configuration of a gate voltage in a measurement mode. Accordingly, the switching element control circuit according to the modification acquires advantageous effects corresponding to advantageous effects among all advantageous effects which the switching element control circuit 100 according to the embodiment acquires.

Although the present invention has been described based on the above-mentioned embodiment, the present invention is not limited to the above-mentioned embodiment. The present invention can be carried out in various modes without departing from the gist of the present invention, and, for example, the following modifications are also conceivable.

(1) The numbers and the like of the constitutional elements described in the above-mentioned embodiment are provided for an exemplifying purpose, and can be changed within a scope where advantageous effects of the present invention are not impaired.

(2) In the above-mentioned embodiment, in a control mode, the gate voltage control part 20 controls a gate voltage based on information which contains a threshold voltage stored in the memory part at the time of bringing the switching element into an ON state. However, the present invention is not limited to such a configuration. A temperature detection element may be disposed in the vicinity of the switching element 200. In a measurement mode, a gate voltage applied to the gate electrode is stored as a threshold voltage of the switching element when the ON/OFF state determination part determines that the switching element is brought into an ON state, and in the control mode, a gate voltage may be controlled based on information which includes the threshold voltage and a detection result of a temperature obtained by the temperature detection element.

(3) In the above-mentioned embodiment, the switching element control circuit controls one switching element. However, the present invention is not limited to such a configuration. The switching element control circuit may control a plurality of switching elements.

(4) In the above-mentioned embodiment, the switching element is formed using a material which contains GaN. However, the present invention is not limited to such a configuration. The switching element may be formed using a material which contains a wide-gap semiconductor such as SiC or $Ga_2O_3$ or may be formed using a material which contains silicon.

(5) In the above-mentioned embodiment, a MOSFET is used as the switching element. However, the present invention is not limited to such a configuration. A switching element other than a MOSFET (for example, a HEMT, an IGBT or the like) may be used as the switching element.

The invention claimed is:

1. A switching element control circuit configured to perform a measurement mode in which a threshold voltage of a switching element having a first electrode, a second electrode, and a third electrode is measured and a control mode in which an ON/OFF operation of the switching element is controlled in a switching manner, the switching element control circuit comprising:

a threshold voltage measurement power source which supplies, in the measurement mode, an electric current to the first electrode of the switching element;

a third electrode voltage control part which controls, in the measurement mode, a third electrode voltage such that the third electrode voltage is increased in a stepwise manner and controls, in the control mode, the third electrode voltage so as to control the ON/OFF operation of the switching element;

an ON/OFF state determination part which determines, in the measurement mode, an ON/OFF state of the switching element; and a memory part which stores, in the measurement mode, the third electrode voltage applied to the third electrode as a threshold voltage of the switching element when the ON/OFF state determination part determines that the switching element is brought into an ON state, wherein the third electrode voltage control part controls, in the control mode, the third electrode voltage based on information including the threshold voltage stored in the memory part at the time of bringing the switching element into an ON state.

2. The switching element control circuit according to claim 1 further comprising a first electrode current detection part which detects a first electrode current flowing in the switching element, wherein the ON/OFF state determination part determines, in the measurement mode, the ON/OFF state of the switching element based on a detection result of the first electrode current obtained by the first electrode current detection part.

3. The switching element control circuit according to claim 1, wherein the third electrode voltage control part controls, in the measurement mode, the third electrode voltage such that the third electrode voltage is increased in a continuous stepwise manner along with a lapse of time.

4. The switching element control circuit according to claim 1, wherein the third electrode voltage control part controls, in the measurement mode, the third electrode voltage such that the third electrode voltage becomes a pulse-like voltage which is a pulse having amplitude increased along with a lapse of time.

5. The switching element control circuit according to claim 1, wherein the switching element is a MOSFET, an IGBT or a HEMT.

6. The switching element control circuit according to claim 1, wherein the switching element is formed using a material which contains GaN, SiC or $Ga_2O_3$.

7. A power module comprising:

the switching element having the first electrode, the second electrode and the third electrode; and the switching element control circuit according to claim 1 which controls an ON/OFF operation of the switching element.

* * * * *